United States Patent [19]

Ferriter et al.

[11] Patent Number: 4,875,162

[45] Date of Patent: Oct. 17, 1989

[54] AUTOMATED INTERFACING OF DESIGN/ENGINEERING SOFTWARE WITH PROJECT MANAGEMENT SOFTWARE

[75] Inventors: Kate M. Ferriter, Atlanta; Robert B. Mathis, Merietta, both of Ga.

[73] Assignee: International Business Machines Corporation, Armonk, N.Y.

[21] Appl. No.: 115,073

[22] Filed: Oct. 28, 1987

[51] Int. Cl.$^4$ .............................................. G06F 15/21
[52] U.S. Cl. .................................................... 364/401
[58] Field of Search ................. 364/401, 518; 434/108

[56] References Cited

PUBLICATIONS

Henry Fersko-Weiss, "Master Plan: Project Management Software", PC Magazine, Sep. 29, 1987, pp. 153–157.
Renouard, C. A., "A Computerized Inventory Model for Production Control", Control Engineering, Apr. 1971, pp. 61–64.
Andrew Layman, Time-Line, pp. 3–9, 18–27, 113–119, 124 ∝ 127, 1984.
Manuel Sotomayor, "Easy to Relate", PC World, vol. 3, No. 4, 128 & 135, Apr. 1, 1985.

*Primary Examiner*—Jerry Smith
*Assistant Examiner*—Gail O. Hayes
*Attorney, Agent, or Firm*—Whitham & Marhoefer

[57] ABSTRACT

A method for the automatic interfacing of a conceptual design tool with a project management tool is disclosed. The conceptual design tool provides for the early manufacturing involvement information needed to aid and improve the total design and manufacturing effort to produce a final product. The conceptual design tool is used to build and modify a product structure. Using the conceptual design tool, a user inputs manufacturing details by item in the product structure. When the user invokes the project mangement tool interface, the system prompts the user to select items of the product structure which are critical. The system then orders the selected items according to lead times from manufacturing detail data gathered by the conceptual design tool. The ordered data is then formatted in a file of the project management tool. The formatted file is then imported into the project management tool. In addition, data modified by the project management tool can later be reformatted for export to the conceptual design tool to allow the design process to continue with updated project data.

4 Claims, 16 Drawing Sheets

```
DEFAULT  EXIT                                           F1=HELP
              EARLY MANUFACTURING INVOLVEMENT DATA
* DEFAULT VALUES

DETAILS FOR . . . . . . . . . . . . .   BATTERY
       ITEM NUMBER. . . . . . . . . . . . .
       IN ASSEMBLY . . . . . . . . . . . .   LAWNMOWER
       TYPE. . . . . . . . . . . . . . . .
       SOURCE STRATEGY . . . . . . . . . .   PURCHASE COMPLETE
       COMPANY . . . . . . . . . . . . . .   SEARS
       QUANTITY OF THIS ITEM USED . . . . .   1
       FUNCTION WITHIN PRODUCT. . . . . . .   POWER UNIT
       MATERIAL OF ITEM . . . . . . . . . .
       BUILD PROCESS . . . . . . . . . . .
         LEAD TIMES
       TOOLING. . . . . . . . . . . . . . .
       PROCUREMENT. . . . . . . . . . . . .
       COMMODITY TYPE. . . . . . . . . . .
       COST. . . . . . . . . . . . . . . .
       ITEM CLASSIFICATION . . . . . . . .

ENTER   F1=HELP   F3=EXIT
```

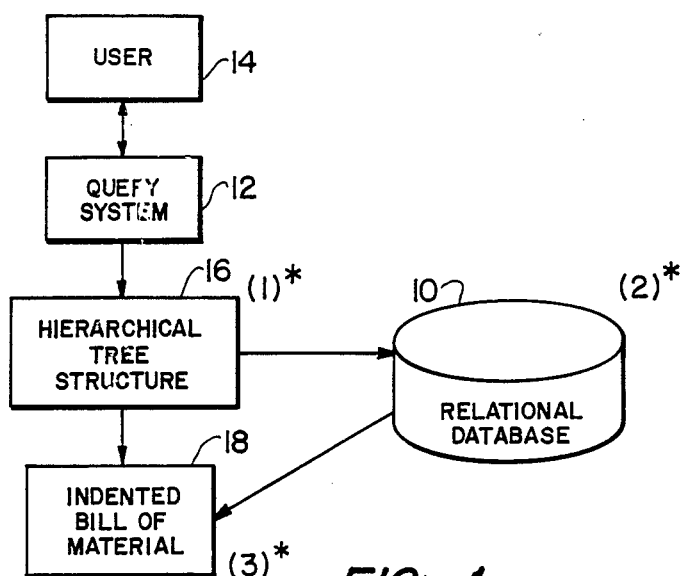
FIG. 1
FIG. 3
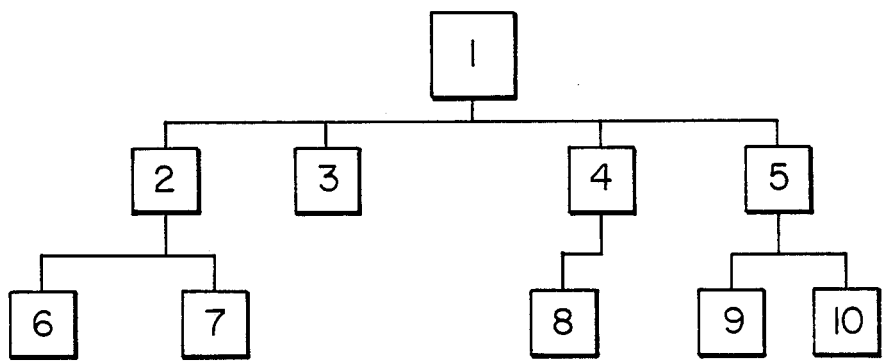
FIG. 2
```
1 x x x x x x x
  2 x x x x x x x
      6 x x x x x x x
      7 x x x x x x x
  3 x x x x x x x
  4 x x x x x x x
      8 x x x x x x x
  5 x x x x x x x
      9 x x x x x x x
     10 x x x x x x x
```
FIG. 4

```
=                                                      ↑ ↓
DEFAULT   EXIT                                        F1=HELP
              EARLY MANUFACTURING INVOLVEMENT DATA
* DEFAULT VALUES

DETAILS FOR  . . . . . . . . . . . .   BATTERY
        ITEM NUMBER. . . . . . . . . . . .    _____
        IN ASSEMBLY . . . . . . . . . . . .   LAWNMOWER
        TYPE. . . . . . . . . . .             _____
        SOURCE STRATEGY . . . . . . . . .     PURCHASE COMPLETE
        COMPANY  . . . . . . . . . . . .      SEARS
        QUANTITY OF THIS ITEM USED . . . . .  1
        FUNCTION WITHIN PRODUCT. . . . . .    POWER UNIT
        MATERIAL OF ITEM . . . . . . . .      _____
        BUILD PROCESS . . . . . . . . . . .   _____
         LEAD TIMES
        TOOLING. . . . . . . . . . . . . .    _____
        PROCUREMENT. . . . . . . . . . . .    _____
        COMMODITY TYPE. . . . . . . . . . .   _____
        COST. . . . . . . . . . . . . . . .   _____
        ITEM CLASSIFICATION . . . . . . . .   _____

ENTER   F1=HELP   F3=EXIT
```

FIG. 6

```
=                                                      ↑ ↓
DEFAULT   EXIT                                        F1=HELP
              EARLY MANUFACTURING INVOLVEMENT DATA
* DEFAULT VALUES

DETAILS FOR  . . . . . . . . . . . .   BATTERY
        ITEM NUMBER. . . . . . . . . . . .    A000              *
        IN ASSEMBLY . . . . . . . . . . . .   LAWNMOWER
        TYPE. . . . . . . . . . .             MAIN ASSEMBLY - 2 *
        SOURCE STRATEGY . . . . . . . . .     PURCHASE COMPLETE
        COMPANY  . . . . . . . . . . . .      SEARS ROEBUCK, INC. *
        QUANTITY OF THIS ITEM USED . . . . .  1
        FUNCTION WITHIN PRODUCT. . . . . .    POWER UNIT
        MATERIAL OF ITEM . . . . . . . .
        BUILD PROCESS . . . . . . . . . . .   ASSEMBLY          *
         LEAD TIMES
        TOOLING. . . . . . . . . . . . . .    0                 *
        PROCUREMENT. . . . . . . . . . . .    2 WEEKS           *
        COMMODITY TYPE. . . . . . . . . . .
        COST. . . . . . . . . . . . . . . .   15.00             *
        ITEM CLASSIFICATION . . . . . . . .   IRS2312           *

ENTER   F1=HELP   F3=EXIT
```

FIG. 7

```
=                       A     M     S                    ↑ ↓
VIEW  DETAIL  BUILD  EXIT                         F1 = HELP
                LAWNMOWER BILL OF MATERIAL
USE ↑ OR ↓ TO SELECT ONE.

BILL OF MATERIAL
       ┌─────────────────────────────────────────────┐
       │ LAWNMOWER                                   │
       └─────────────────────────────────────────────┘
            •    HANDLE ASSEMBLY
            •       UPPER HANDLE ASSEMBLY
            •          HANDLE 18GA STEEL-CHROME PLATED
            •          SLIDE STRAIN RELIEF
            •          BOLTS (4)
            •          WASHER (4)
            •          LOCKING KNOBS (4)
            •          SHOULDER BOLT (2)
            •       LOWER HANDLE ASSEMBLY
            •          LOWER HANDLE 16GA STEEL-CHROME PLATED
            •          SHOULDER BOLTS (2)
            •          NUTS (2)
            •          HANDLE BRACKET WASHER
```

FIG.13

AUTOMATED INTERFACING OF DESIGN/ENGINEERING SOFTWARE WITH PROJECT MANAGEMENT SOFTWARE

BACKGROUND OF THE INVENTION

1. Field of the Invention

The present invention generally relates to a computer based project management system and, more particularly, to a system which automatically interfaces a project management tool to a conceptual design tool to provide an integrated approach to hardware product design. The conceptual design tool uses a top-down functional approach to product design which involves creating and exploiting a hierarchical tree view of the product structure early in the design process. The invention provides an interface for the detailed information gathered from the user and relational database of the conceptual design tool for early manufacturing involvement as well as bill of material and feasibility cost estimating to a computerized project management tool.

2. Description of the Prior Art

The process of designing, developing and manufacturing a new product, or making major changes to existing products, presents many challenges to product managers and engineers to bring the product to market for the least cost, within schedule while maintaining product quality. In today's highly competitive industries, product managers and engineers require information to address many problems that arise because of the complexity of new products and the complexity of world-wide production and the changing nature of competition. Because new products need to be brought to market in a very short time period to meet the competition, the traditional learning curve formerly associated with product development has disappeared, creating the need to better control product release and determine cost impacts of designs early in the design process.

To meet these needs, many companies are realizing that the conventional product design process is not satisfactory. They require early involvement of manufacturing engineering, cost engineering, logistics planning, procurement, manufacturing and service/support with the design effort. In addition, they require planning and control of product data through design, release and manufacturing.

Project Management, as a modern management tool, has its origins in the early part of this century when Henry L. Gantt, while working for the government during World War I, developed his now famous visual aid for work control. The Gantt chart is a graphic representation of a project schedule that shows each task as a bar having a length proportional to the duration of the task. Later during the 1950s, Dr. John Presper Mauchley, a co-inventor of the EDVAC at the University of Pennsylvania, developed the Critical Path Method (CPM) which was further developed by Willard Frazer, a consultant on the Polaris submarine project. Frazer's contribution was called Program Evaluation and Review Technique (PERT). A PERT chart is one that resembles a flow chart showing predecessor and successor tasks of a project and the critical path.

PERT/CPM models are known and have been used for many years by many large corporations for project management. Such project management tools were first implemented on main frame computers and then on mini computers, equipment which was readily available to large corporations but not to small corporations and firms. More recently, various project management software products have been developed for micro or so-called personal computers. An example of a project management tool which was originally written as a mainframe program and later rewritten as a personal computer program is *Plantrac*, published by Computerline, Inc. This program was originally written in England for the construction industry and later imported to the U.S.A. The first project management tool written specifically for the personal computer was called the *Harvard Project Manager*, now published by Software Publishing Corp. There are now over one hundred project manager applications written for personal computers. These have made computer based project management tools more economically accessible to small corporations and firms, but their application requires some degree of sophistication on the part of the user. As a result, many small corporations and firms still use manual methods of project management, often relying on an expediter to stay one step ahead in scheduling supplies and work on a day to day basis.

Rupert A. Schmidtberg and Mark A. Yerry in an article entitled "Designing Complex Assemblies Using the Top-Down Approach" published in *Autofact 1986 Proceedings*, at pages 9-31 to 9-43, describe a design approach where the engineer first creates the top-most assembly and works downward, filling in details of the subordinate subassemblies and parts. In this approach, a hierarchical representation of the design object is built and refined. As a design concept is refined, design constraints are communicated down the hierarchy. Evaluation of the design concept at each level of refinement may cause feedback to be passed up the hierarchy in the form of recommendations for design changes or requests to relax some design constraints.

This top-down design approach has significant advantages over the traditional approach to design of a new product. The Schmidtberg and Yerry implementation, however, is in the environment of a CAD/CAM system which assumes a high degree of computer design sophistication on the part of the user. What is needed is a simpler to use system which takes advantage of the top-down design approach and which then provides an interface with a project management tool to fully integrate the design and production of new hardware products.

SUMMARY OF THE INVENTION

It is therefore a general object of the present invention to provide an easy to use system which implements a top-down functional approach to hardware product design and then automatically inputs the information gathered from the user to a project management tool.

It is a more specific object of the invention to provide an interface which inputs the detail information gathered using a conceptual design tool as an input to a project management tool.

According to the invention, a sketch sheet approach on a computer display is used to enter the functional design of a product. The user needs to key in only part descriptions, and the system automatically draws a hierarchical tree structure on the computer display. The user is then prompted to consider, part by part, all of the parts in the product. A series of menus pop-up and guide the user through manufacturing planning for the part.

The process begins by producing a functional sketch of the product design. This sketch is in the form of a hierarchical tree structure, thereby encouraging the top-down design approach. The system queries the user for component parts of the product, and as the query process progresses, the tree structure is created on the computer screen for the user to view.

Behind each element, or item, in the functional hierarchy of the product, associated manufacturing information is gathered. This manufacturing detail is used for product release planning and scheduling, and manufacturing planning, as well as for feasibility level cost estimating. The user has the option at any time during the design process to deal with the proposed product or product components at a high level or at a very detailed level. At any level, manufacturing details which are not known by the user can be defaulted from a database using the known item attributes.

The product designer is aided in implementing early manufacturing involvement, or the integration of the design process with manufacturing and other production-related concerns. The designer is prompted to enter manufacturing data for each item in the product structure, thus introducing a third dimension to the hierarchical tree structure. This third dimension serves several purposes. The manufacturing data can be manipulated to produce needed estimates and schedules for the designer. The manufacturing data of interest falls under four categories: (1) information which assists in planning the manufacture of the product, (2) information which assists in producing a cost estimate of the product, (3) information which assists in generating a product release schedule, and (4) information which will assist a CAD/CAM designer in locating similar items. In the fourth instance, the designer then has the option to use the similar design, avoiding another design effort, or to use the existing design as a template to modify or for other guidance in preparing the new design.

The hierarchical approach implemented by the invention provides a convenient interface to product costing, as early cost estimates will consider only the very high level assemblies and very little detail. As the release plan reaches completion, however, much more detail is available and the product cost estimate will roll up the more detailed tree structure to provide a more precise estimate. Cost estimates at the very early development phase of the product help determine product feasibility as well as to direct engineering effort at the most significant portions of the design.

The manufacturing detail information gathered using the conceptual design tool is automatically input to a project management tool. The automatic transfer of information required to generate a release schedule is a major usability and productivity enhancement over existing semi-manual project management systems. This process utilizes available in formation, knowledge and interrelationships previously gathered through other required phases of planning the product release plus user interactivity to produce a product release activity sequence and schedule. No direct user interface to the project management tool is required, since all tasks and activity times have been gathered by the conceptual design tool in defining the product structure. The only additional information which the user needs to supply is the available capacity of each resource.

BRIEF DESCRIPTION OF THE DRAWINGS

The foregoing and other objects, aspects and advantages of the invention will be better appreciated from the following detailed description of a preferred embodiment of the invention with reference to the drawings, in which:

FIG. 1 is a system block diagram showing the functional requirements for implementing the automated bill of material according to the invention;

FIG. 2 is a pictorial representation of a hierarchical tree structure showing the functional representation of the components of a new product;

FIG. 3 is a table illustrating the organization of the database for the hierarchical tree structure shown in FIG. 2;

FIG. 4 is a generalized illustration of an indented bill of material produced by the invention from the relational database table shown in FIG. 3;

FIG. 6 is a screen illustrating the computer display of early manufacturing involvement data for one component of the structure shown in FIG. 5;

FIG. 7 is a screen illustrating the computer display of early manufacturing involvement data for one component with default data entered by the system;

FIG. 13 is a screen showing a page of the indented bill of materials created from the examples shown in FIGS. 11 and 12;

DETAILED DESCRIPTION OF A PREFERRED EMBODIMENT OF THE INVENTION

Figure 5:
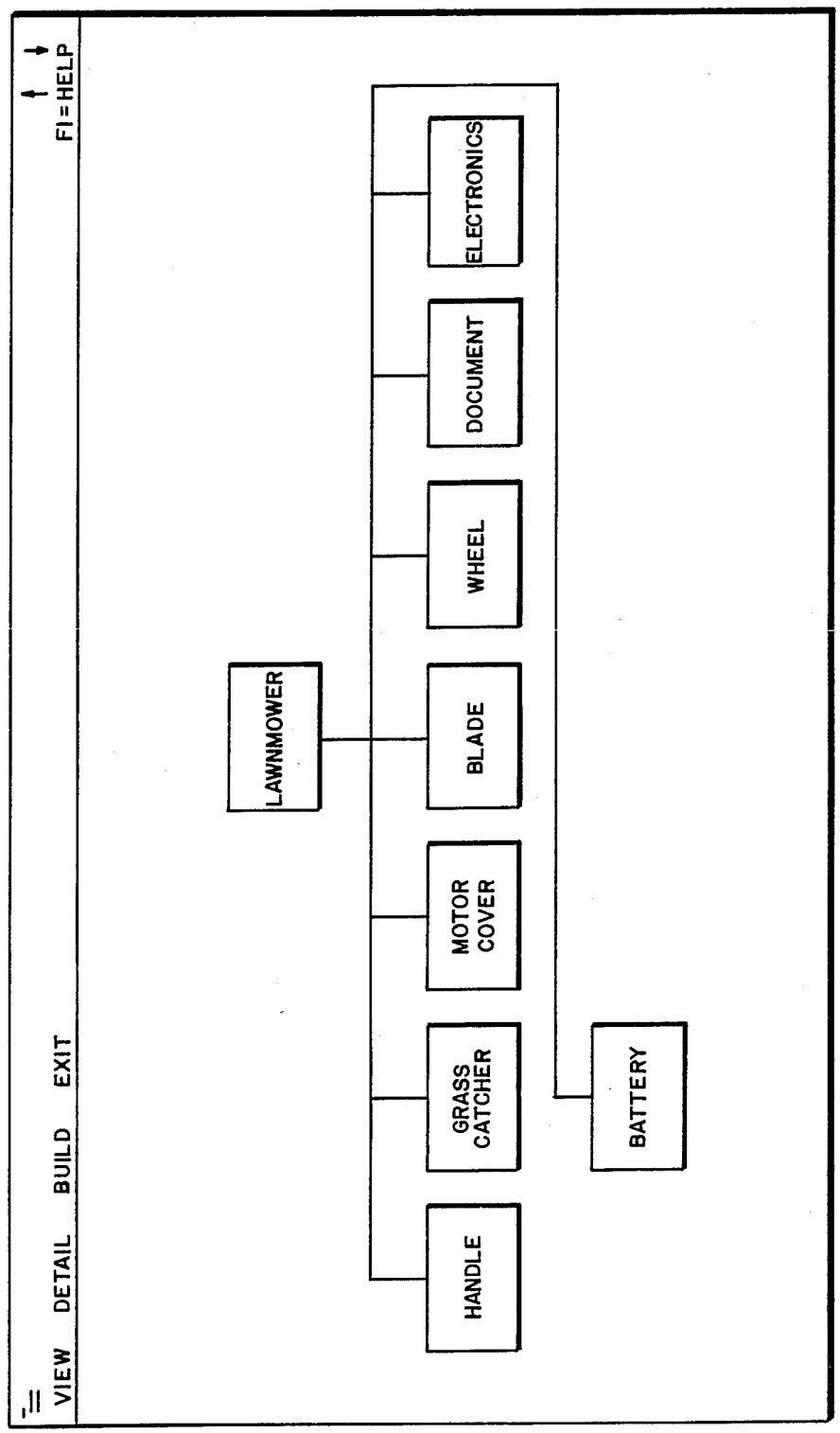
FIG. 5 is a screen illustrating the computer display of a hierarchical tree structure generated by the system for a planned product under design.

Referring now to the drawings, and more particularly to FIG. 1, there is shown in functional block diagram form an automated bill of material system. The key parts of this system are the database 10 and the query system 12. The database 10 could be any of several products currently available, but for purposes of the preferred embodiment, IBM's DATABASE 2 (DB2) is used. DB2 is a relational data base management system, but it will be understood by those skilled in the art that other data bases, including hierarchical data bases, could be used. The query system 12 could be an expert system, but for purposes of the preferred embodiment, IBM's Restructured Extended Executor (REXX)

language is used. General information on IBM's DB2 can be had with reference to publication GC26-4073-2 published by IBM Corp. A description of the REXX language is provided in *Virtual Machine/Systems Product, System Product Interpreter User's Guide*, Release 4, publication SC24-5238-2 published by IBM Corp.

The user 14 is first queried on the functional product structure by the query system 12, and in response to the user input, the database 10 captures the structure in a table. The query session begins by prompting the user to input the name of the product. The product might be a new lawnmower, for example, and the user would simply type in "LAWNMOWER". Then the query system asks the user to list the major components of the product. In the case of the lawnmower, this might be a frame assembly, an engine, a bagging assembly, and a handle and control assembly. These would be individually entered by the user in response to a prompt to enter the next component or indicate that there are no more major components by entering "END". Once the major components have been entered by the user, the user enters "END"0 causing the query session to then examine the subcomponents of the major components that have been entered. For example, the query system 12 would prompt the user 14 to enter the components of the frame assembly. These components might be engine deck and wheels. Again, when all the subcomponents for the frame assembly have been entered, the user enters "END", causing the query system to next prompt the user to enter the components of the engine. In this case, a complete engine assembly might be procured from an outside source so that there are no components to be listed by the user, so the user simply enters "END". The process continues until the user has entered all the components of the new product to a level of detail desired.

As the query session progresses, the components entered by the user 14 are captured in a table by the relational database 10 and a functional hierarchical tree of the structure 16 is generated on a computer screen. A generalized example of this tree structure is shown in FIG. 2 of the drawings. If a subassembly appears more than one time in a product, the subassembly also appears multiple times in the tree. In this example, the tree structure has three levels. It may have as few as two levels and, within practical limits, an indefinite number of levels depending on the product and the level of detail required to define that product. In a specific embodiment of the invention, up to thirty levels of the tree structure are allowed. Experience indicates that this is sufficient for all but the most complex of products. For the example of a new lawnmower, block 1 in FIG. 2 would contain the legend "LAWNMOWER". This block would be generated immediately upon the entry of the word "LAWNMOWER" by the user 14. Then, as the user enters the names of the major components of the lawnmower, block 2 would be generated with the legend "FRAME ASSEMBLY", block 3 would be generated with the legend "ENGINE", block 4 would be generated with the legend "BAGGING ASSEMBLY", and block 5 would be generated with the legend "HANDLE AND CONTROL ASSEMBLY". As these blocks are generated, lines connecting them to block 1 are also generated. Then in the next level, block 6 with the legend "ENGINE DECK" is generated followed by block 7 with the legend "WHEELS", again with lines connecting these blocks to block 2. Since the engine is being purchased as a complete assembly and no subcomponents were entered by the user, there is no block under block 3. Blocks 8, 9 and 10 are then generated as the user enters subcomponent data in response to the query session.

The database 10 captures the component information from the user input in a table having the form shown in FIG. 3. Comparing this table to the hierarchical tree of FIG. 2, it will be observed that under the heading "ITEM" the numeral 1 is listed four times with the numerals 2, 3, 4, and 5 immediately to the right. This is followed by the numeral 2 listed twice with the numerals 6 and 7 immediately to the right. Thus, the table shown in FIG. 3 directly describes the hierarchical tree structure from which the graphical representation illustrated in FIG. 2 is generated for display on the computer screen. The user views this tree structure and can check it for correctness as it is generated and after the product structure is established by the end of the query session.

Referring back to FIG. 1, once the product structure is established, the next operation is to build an indented bill of material 18. For the product generally represented by the hierarchical tree structure shown in FIG. 2 and the relational database table shown in FIG. 3, the indented bill of material would have the general form shown in FIG. 4. Those skilled in the art will recognize that FIG. 3 shows the logical storage of the product data structure and FIGS. 2 and 4 show two, alternative representations of the data. This bill of material is built by accessing the database table for the product. The table is accessed by item number. In the top level, item 1 is not indented. The second level items 2, 3, 4, and 5 are indented one space. The third level items 6, 7, 8, 9, and 10 are each indented two spaces, and so on. The application code follows the item hierarchy as follows: Item 1 appears on the top line. Item 2 appears on the second line. Then the database is searched for item 2 antecedents. Items 6 and 7 would be found. Item 6 would then appear on the third line. The database is then searched for item 6 antecedents. In this example, none would be found, and item 7 would then appear on the fourth line. Again, the database is searched for item 7 antecedents, but again none would be found, and item 3 would appear on the fifth line. The remaining items are similarly processed until a complete bill of material is produced.

FIG. 5 shows a concrete example of a hierarchal tree structure generated on the computer screen during the query process. While only two levels are shown, those skilled in the art will understand that, within practical limits, a plurality of levels may be generated depending on the product and the level of detail required to define that product. Also, depending on the capabilities of the display system being used, the hierarchal tree structure may be displayed on several successive screens as the level of detail progresses.

To do product costing, a product structure is first created using the hierarchical tree structure. For each item in the product structure, the user must enter known manufacturing information. From this information, cost estimates can be drawn from the database 10. The user inputs a rough estimate on overall product assembly time in hours per unit, as well as a contingency factor, like 15%. The system decomposes the product structure into a parts list, which is the indented bill of materials. The quantity of each part as well as cost per part are pulled from the manufacturing information table in the relational database associated with each item. The cost estimating function then multiplies each part on the list by quantity of that part, then by cost of the part. The results for the parts list are added. The labor estimate is multiplied by the standard hourly labor and burden rate. The results of the parts list multiplication and the labor multiplication are added, and the result is output to the user.

FIG. 6 shows a screen from a computer display which would appear when the user selects, for example, BATTERY as the object and chooses the action "DETAIL". The design engineer keys in known manufacturing data using this screen. In this example, the designer intends to use an "off the shelf" battery to be purchased complete from Sears. There is one battery in the product structure, and its function is power unit. The user can then choose to have default values supplied from the relational database based on known item attributes. The user selects the "DEFAULT", and the screen shown in FIG. 7 is displayed. The method by which the relational database can access these defaults is by accessing the table in which the user input data was captured during the query session. More specifically, the attributes in the table are accessed by attribute numbers and these numbers, in turn, are used as an index to access the default attributes for the items, these values having been previously been stored for similar parts in the database. The screen shown in FIG. 7 displays the resultant default values, marked by an asterisk. The system has generated an item number, A000. From the position of the item within the tree, the system has determined that it is a Main Assembly. The full name of the vendor, Sears Roebuck, Inc., is inserted. The process by which the battery is incorporated into the product is assembly. Tooling lead time defaults to zero since the item is purchased complete off the shelf. The cost per battery, based on actuals, is 15.00. An item classification, or group technology classification is system generated based on the gathered attributes, function, sourcing strategy and vendor. This item classification code can be used in many production planning functions, including scheduling and procurement.

Figure 8:
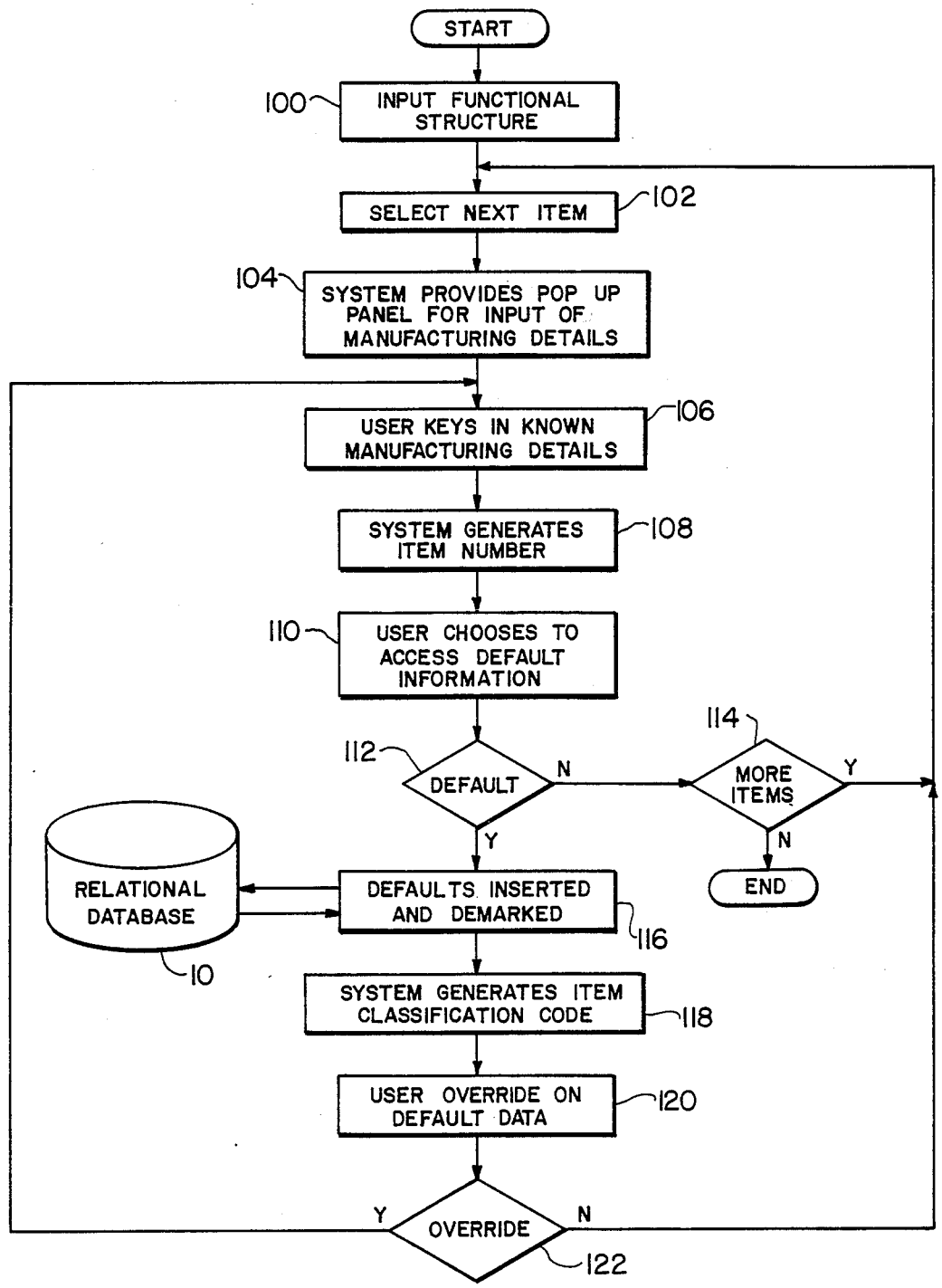
FIG. 8 is a flow chart showing the logic of the conceptual design tool implemented in software.

Referring now to FIG. 8, there is shown a flow chart of the logic of the conceptual design tool implemented in software. One of ordinary skill in the art can write source code from this flow chart in any suitable computer language, such as BASIC, Pascal or C, for any desired computer system, such as the IBM Personal System (PS) computers which support those computer languages.

The process begins by inputting the functional structure of the product as indicated by function block 100. This is done during the query session as is described in more detail with reference to FIG. 9. Once the functional structure of the product has been input and the hierarchical tree structure has been generated to the current level of detail desired, the user is prompted to select an item in the structure in function block 102. When the user selects an item, the system provides a pop-up panel for manufacturing details in function block 104. This pop-up panel allows the user to key in known manufacturing information in function block 106. When this information has been input by the user, the system generates an item number in function block 108. The system then allows the user to choose to access default information in function block 110. A test is made in decision block 112 to determine if the user has choosen to access default information. If not, a test is next made in decision block 114 to determine if there are more items for which manufacturing details are to be input. If so, then the process loops back to function block 102.

Assuming that the test in decision block 112 is positive, that is, the user chooses to access default information, then in function block 116, the system accesses the default values in database 10 and inserts those values. Then, in function block 118, the system generates an item classification code. The user is given the option of overriding any of the default data in function block 120. A test is made in decision block 122 to determine if the user chooses to override any default data. If so, the system loops back to function block 106 which allows the user to key in known manufacturing data as a typeover of the previously inserted default data; otherwise, the system loops to function block 102 to select the next item in the functional structure of the product. Eventually, the test in decision block 114 will be negative, and the process ends.

Figure 9:
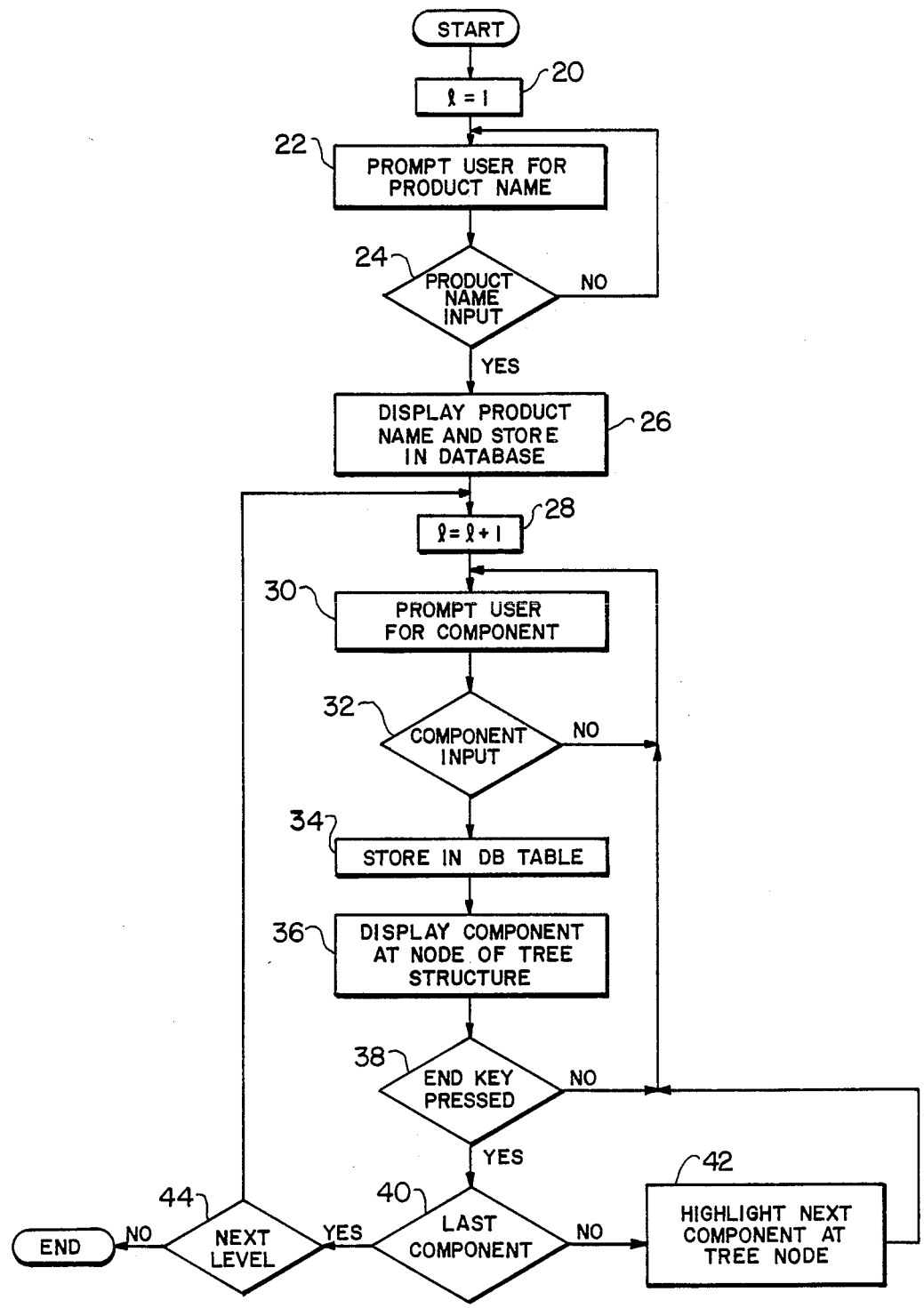
FIG. 9 is a flow chart showing the logic of the query session during which the hierarchical tree and table of FIGS. 2 and 3, respectively, are built in the database.

FIG. 9 shows in flow chart form the logic of the query system according to the invention. The program logic represented by FIG. 9 is what builds the database represented by FIG. 3. This flow chart in combination with a dialog system, such as IBM's REXX language, and a database system, such as IBM's DB2, is sufficient for a programmer of ordinary skill in the art to write the required code to implement the query system. With specific reference to FIG. 9, the process begins by setting l=1 at block 20, where l is the product or component level. Then, at function block 22 the user of the system is prompted for the product name. In the example given, the name would be "LAWNMOWER". The system waits for a user input at decision block 24, and when the product name has been input, the system opens a file in the database with the product name and displays the product name on a computer screen in function block 26. In block 28, l is set to l+1 indicating the next level of components, and the system then prompts the user in function block 30 for the components of the product at this level. Each time the user inputs a component as detected by decision block 32, the inputted component is stored in the database, for that level in function block 34, and the system displays the inputted component on the computer screen at a node of the tree structure in function block 36. The system will continue to prompt the user for components after each component is entered by the user until the user presses an END function key which signals an end to the list of components for this level. Thus, the system tests the user input in decision block 38 for the END function key input. If that key input is not detected, then the system waits for the next user input in decision block 32, and when an input is received, the component is stored in the database table in function block 34 and so forth.

Once all the components have been input by the user for a given level as indicated by pressing the END function key, the system then determines in decision block 40 if the last component in the current level of components has been input by the user. If not, the next component in the current level is highlighted in the displayed tree structure, and the system loops back to function block 30 where the user is again prompted for components of this component. On the other hand, if the last component of the current level of components has been input by the user as detected in decision block 40, the system tests for a user input in decision block 44 to determine if components are to be entered for the next level. This is accomplished by the user pressing a Y key or an N key when prompted for the next level. If the Y key is pressed indicating that the user now wants to input the next level of components, the system loops back to block 28 to index to the next level. If on the other hand, the N key is pressed indicating that the user does not at this time wish to input the next level of components or that there is no next level of components to enter, the query process ends.

Figure 10:
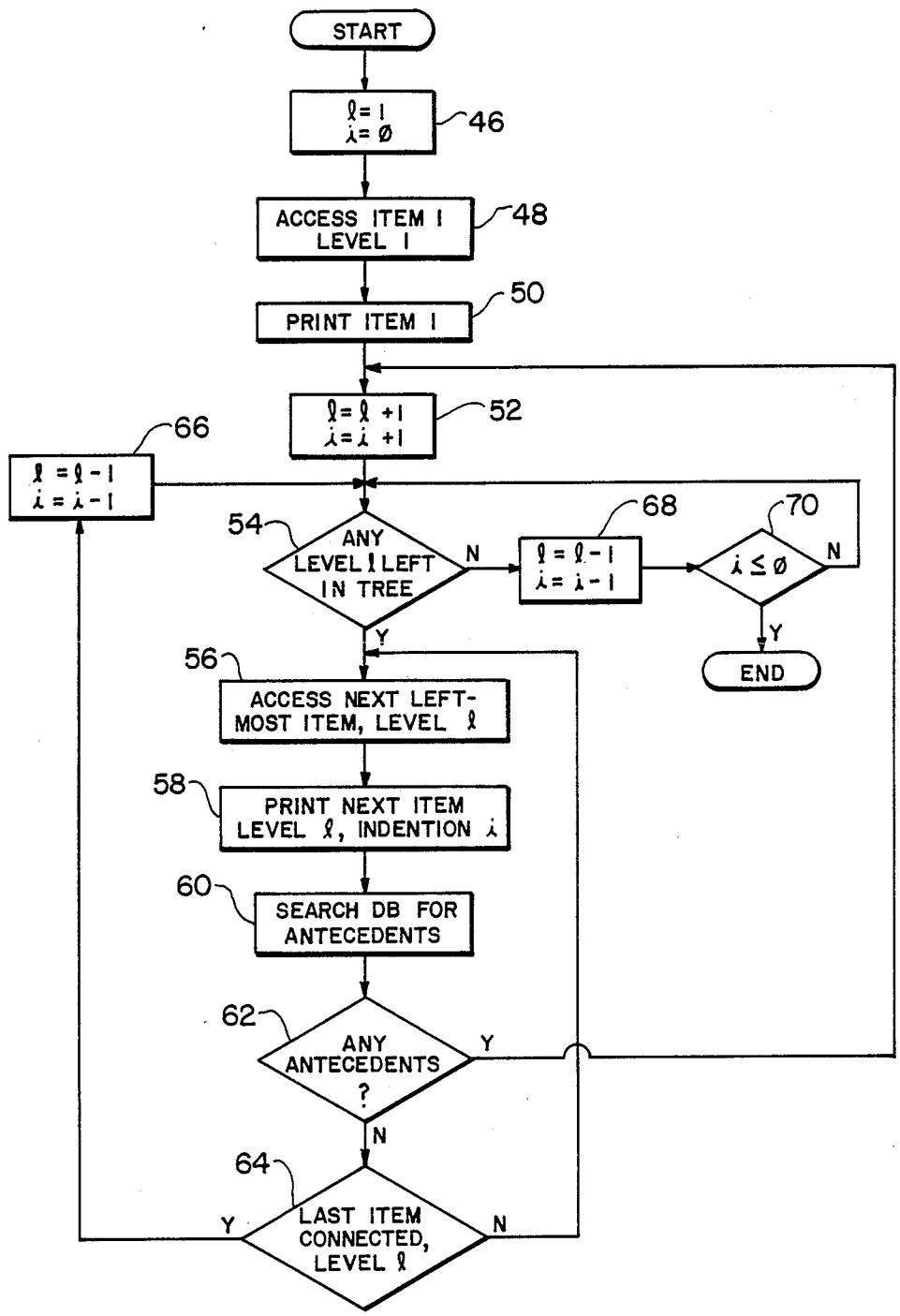
FIG. 10 is a flow chart showing the logic of the generation of the indented bill of materials shown in FIG. 4 using the table in the database.

Turning now to the flow chart of FIG. 10, this figure shows how the indented bill of materials is automatically generated from the table in the database which was built during the query session. Again, this flow chart shows the logic of the automatic generation of the indented bill of materials, and any programmer skilled in the art with an understanding of database systems, such as the IBM DB2 database, can write code to implement the invention from the logic of the flow chart. The process begins in FIG. 10 by setting l=1 and i=0 in block 46, where l is the component level as before and i is the indentation of the bill of materials. Next, item 1 of level 1 is accessed in function block 48. In the example given, this item is the product name "LAWNMOWER". Item 1 is then printed in function block 50, and l and i are then indexed by adding 1 to each. A test is then made in decision block 54 to determine if any level l is left in the tree. If so, the system accesses the next left-most item in the tree of the current level in function block 56. The accessed item is then printed in function block 58 with indentation i. A search is then made of the data base in function block 60 for antecedents. If any are found in decision block 62, the system loops back to block 52 where the level and indentation are indexed by one. Otherwise, a test is made in decision block 64 to determine if the last item of the current level has been connected. If so, the level and the indentation are indexed backward in lock 66 by subtracting one from each. The process then returns to decision block 54 to continue the process of accessing and printing items in order. When the test in decision block 54 becomes negative, that is there are no levels l left in the tree structure, the level and indentation are again indexed backward by subtracting one in block 68. A test is then made in decision block 70 to determine if the indentation i is less than or equal to zero. If not, the process loops back to decision block 54; otherwise, the indented bill of materials is complete and the process ends.

Figure 11:
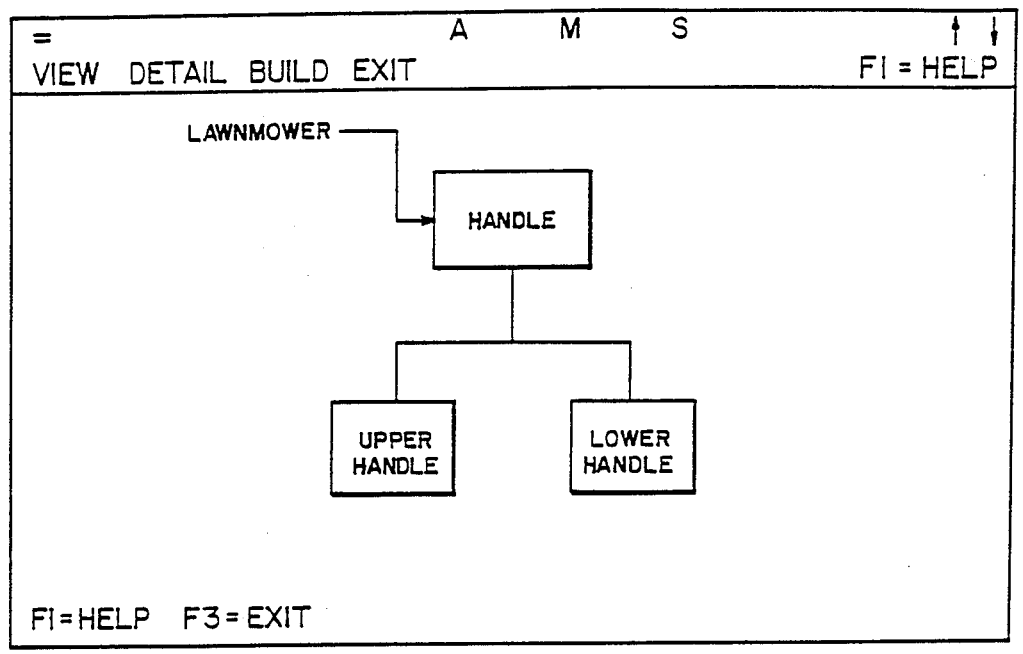
FIG. 11 is a screen showing a specific example of two levels of detail in a tree structure for a lawnmower handle using the subject invention
Figure 12:
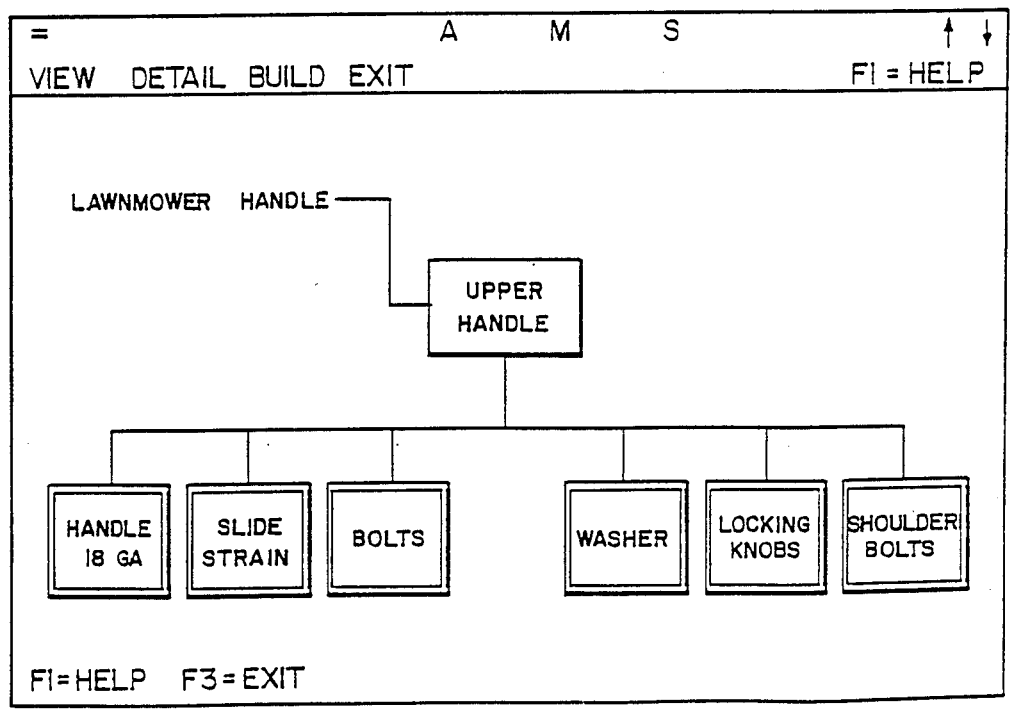
FIG. 12 is a screen showing the example of FIG. 11 expanded to three levels of detail in the tree structure.

Having described the logic of the system, the user interface of a further specific example will be illustrated by way of screen dumps. The first of these is shown in FIG. 11 which shows the product "LAWNMOWER" and a first major component "HANDLE" with two of its subcomponents "UPPER HANDLE" and "LOWER HANDLE" displayed in a simple tree structure. This tree represents three levels in terms of the logic illustrated by the flow charts of FIGS. 9 and 10. In FIG. 12, the user has input the components of a fourth level for the subcomponent "UPPER HANDLE". From these two illustrations, it will be apparent the manner in which each component level is built by user input to the system. Finally, in FIG. 13 the indented bill of materials for the handle assembly of the lawnmower is shown as it appears on the computer screen. Note that the bill of material may be scrolled up or down by the cursor keys as indicated in order to display the complete bill of material as generated from the data base.

From the foregoing, it will be appreciated that even the most unsophisticated computer users will be able to quickly produce a bill of material for a new product using the system according to the invention. The process will help to identify those components and subcomponents of the product which require more specification as to source or structure early in the design stage.

The next stage in the process is to input the data gathered by the conceptual design tool to a project management tool. The preferred embodiment of the invention provides and interface between the conceptual design tool and the Management And Project Planning System (MAPPS) project management tool published by Mitchell Management Systems, Inc. This program includes two utility programs called MAPPOUT and MAPPIN. MAPPOUT enables the user to access network data contained in MAPPS networks by taking the interlocking MAPPS network data files and by putting that information into ASCII format. The restructuring essentially unlocks the files, separates the MAPPS network data, and makes it accessible to create new report formats or to recombine it with data from other programs. MAPPIN allows the user to extract data from other programs and to incorporate it into MAPPS. MAPPIN is an interface that enables data from another program to be inserted directly into MAPPS network data files.

While the MAPPS project management tool is used in the preferred embodiment of the invention and represents the best mode of practicing the invention, those skilled in the art will appreciate that other project management tools with similar capability and function could be adapted for use in the practice of the invention.

With the present invention, no direct user interface to the project management tool is required, since all tasks and activity times have been gathered by the conceptual design tool for each item in the product structure. The only additional information which the user needs to supply is the available capacity of each resource. The information available from the conceptual design tool includes the technology required to produce the item, item type, item classification code, procurement source, lead time to design the item, lead time to simulate the time (if required), lead time to prototype the item, lead time to provide tooling to make the item (if required), time to release the item from engineering to manufacturing, lead time to procure the item (if required), time to transport the item from vendor (if required), time to inspect the item (if required), and time to retrieve the item (if required).

Project management techniques are used to schedule product release. The user submits a product structure which also carries manufacturing detail for each item for a product release schedule. Items within the structure for which there are missing lead times are highlighted, although missing lead times may be defaulted to standard default time if the user does not override. The user reviews the application profile, and restricted update of the release planning assumptions can be done. Using DEFINITION OF ITEM CRITICALITY function, the user can modify the rules which determine whether an item is critical. Only critical items within the product structure are sent to the project management tool. Criticality factors include item cost, item procurement and tooling lead times, and new technology factors. Assumptions also include forward and backward project scheduling, and a project completion date if backward scheduling is chosen. Also necessary is a default estimate for each of the following:

Time unit of measure, either days or weeks.

Design time for the average part in the assembly. Unusual design times are specified in the manufacturing detail. The number of designers as resources for the project is also required.

Simulation time per part. The number of simulators available as resources for the product is also required. If the same people do both design and simulation, a proportional amount of resource should be allocated to both activities.

Prototyping time per part. The number of prototyping resources available for this product is required. If the same people do both design, prototyping and simulation, a proportional amount of resource should be allocated to each of the three activities. Default tooling time per part (if the user did not indicate a time within the manufacturing detail information, the default will be used rather than no information at all). If tooling resource can be capacitating, the number of tooling resources should be specified.

Default time to release an item from engineering to manufacturing.

Default procurement time per part.

Default transportation time per part.

Default inspection time per part.

Default retrieval from stores time per part.

Default assembly time (the default time may be zero, since assembly time typically is much smaller than any other time considerations).

The amount of time the enterprise allots to perform engineering preanalysis for a product.

The amount of time the enterprise allots to perform formal release for a product.

Percent contingency to built into the plan.

In addition, the holiday schedule of employees assigned to the product must be verified.

The product structure is decomposed into a parts list by the system, as has already been described. DEFINITION OF ITEM CRITICALITY function is invoked, and based on the user's chosen factors, the parts list is modified. All manufacturing detail information on each part on the list is passed to this function. Items which are not critical are eliminated from the list using the DEFINITION OF ITEM CRITICALITY function. The system then invokes the RELEASE PROJECT MANAGEMENT function. The critical parts list and corresponding lead time information are passed to the project manager. Each part requires a certain zero or non-zero amount of unit time for design, simulation, prototyping, tooling, procurement, transportation, inspection, retrieval from stores, product preanalysis, and formal release. The RELEASE PLAN PROJECT MANAGEMENT function operates in either forward or backward scheduling mode. In forward scheduling mode, each item has a series of time and resource consuming events associated with it. The user does not determine the first customer ship date for the product until the project manager has completed the release schedule. The project manager needs to select the longest lead time item, and schedule it first. Any resources consumed are subtracted from available resources. The project manager continues to select long lead time items, until all are scheduled. Resources will not be overallocated, as the first customer ship date will be pushed out for both time and resource reasons. Backward scheduling involves choosing the first customer ship date and working backward to fit all required activities in prior to that date. During this process, available resources may be overallocated. The project manager needs to highlight that fact to the user, but continue the scheduling process, as the user may be able to get additional resource if the need arises.

A detailed product schedule by item is then produced, for all critical items. The procedure described may be iterative with both product structuring and cost estimating.

The user then needs to create engineering changes to implement the product release. That process begins with the detailed product schedule with release dates for each critical item within the product. The user request engineering changes bundling and inputs the desired frequency for engineering change package releases. Frequencies would typically be one per month or two week periods. An engineering change number for each engineering change release is then generated by the system. The system determines the release date for each item in the release schedule. These dates are grouped into the time periods as defined by the user. EC NUMBER ASSIGNMENT function is invoked to system generate an engineering change number for each engineering change release required.

Figure 14A:
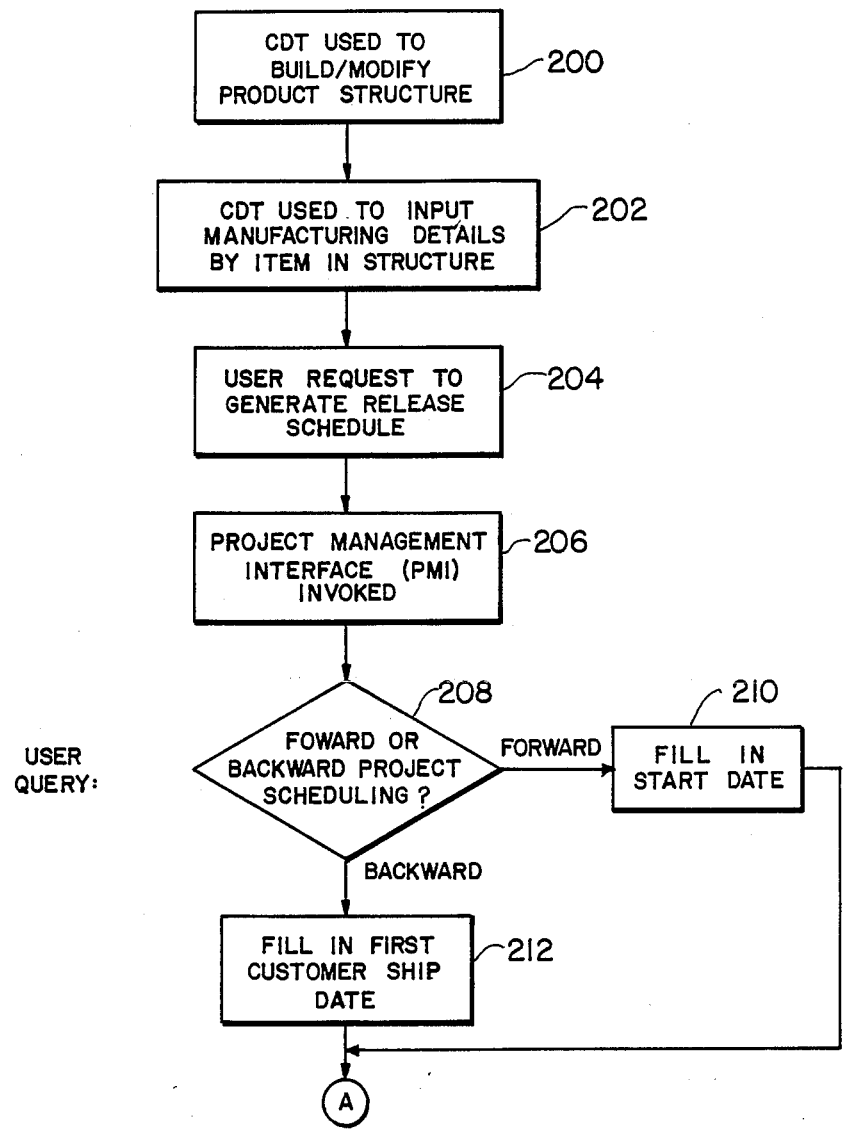
FIGS. 14A, 14B and 14C, taken together, are a flow chart of the automated interface to the project management tool according to the present invention.
Figure 14B:
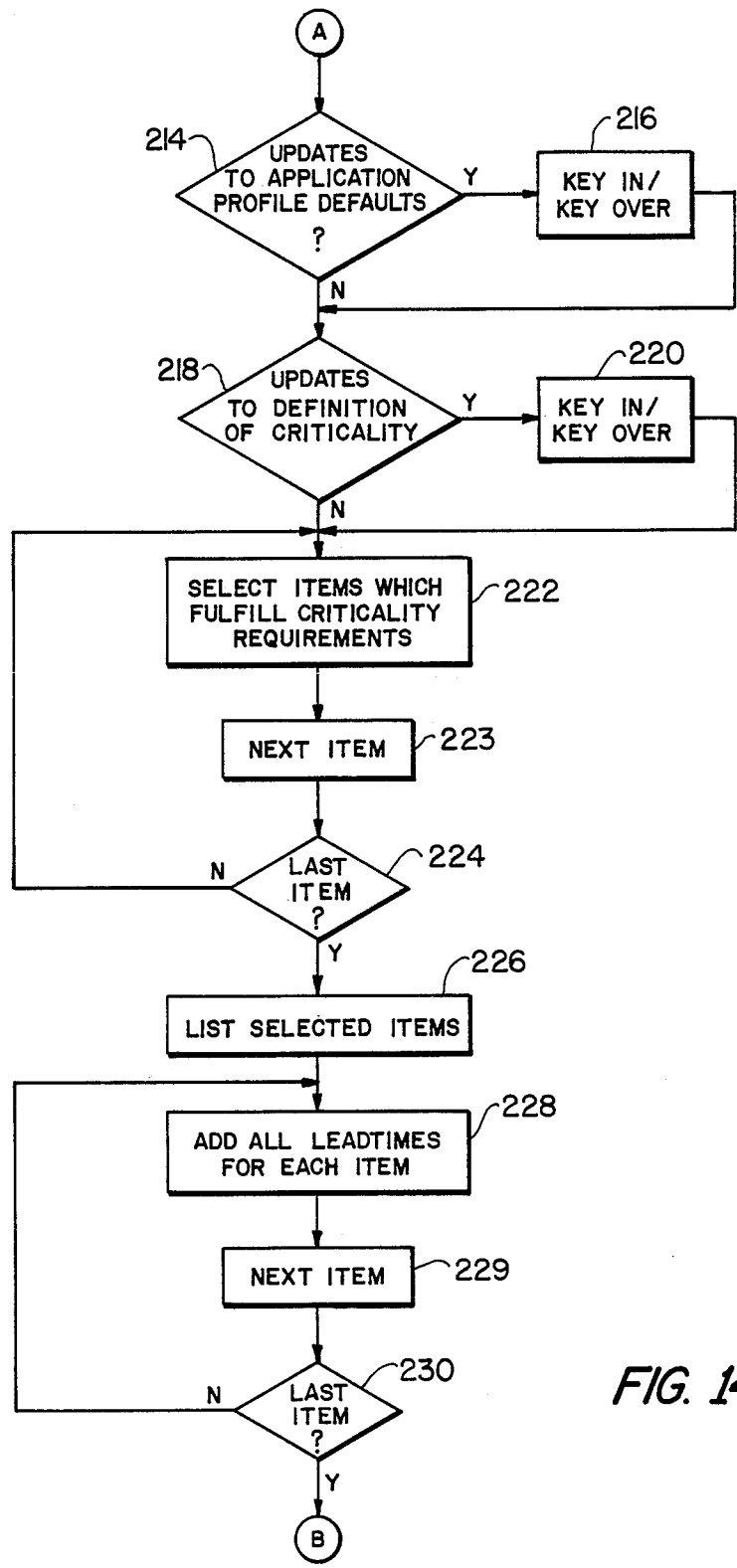
Figure 14C:
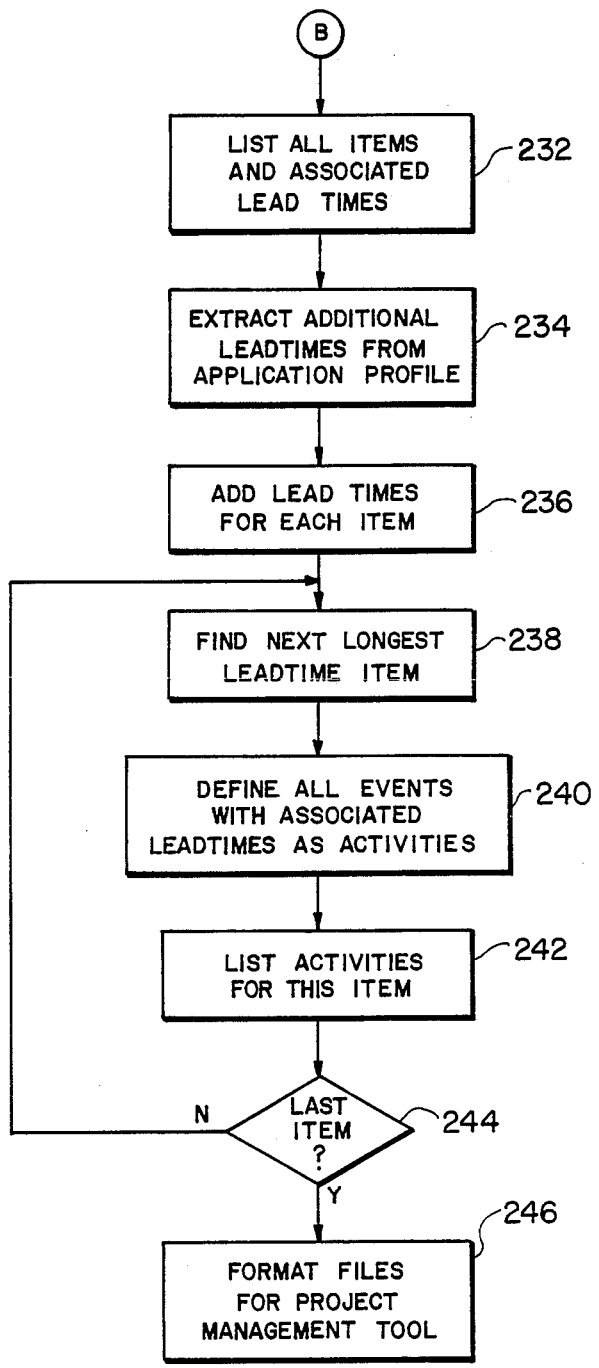

With this brief introduction, reference is now made to FIGS. 14A, 14B and 14C which, taken together, form a flow chart of the automated interface to the project management tool. The logic depicted in this flow chart is sufficient for a programmer of ordinary skill in the art to write source code in a high level language such as BASIC, Pascal or C to implement the invention. The process begins in FIG. 14A where, in function block 200, the conceptual design tool (CDT) is used to build and modify the product structure. This process was described with reference to FIG. 9. Next, in function block 202, the conceptual design tool is used to input manufacturing details by item in the structure. This process was described with reference to FIGS. 6, 7 and 8. At this point, the user can request the generation of a release schedule, as indicated in function block 204.

When the user requests the generation of a release schedule, the project management interface according to the present invention is invoked in function block 206. The manner in which the data files generated by the conceptual design tool are formated for the project management tool is described in detail with reference to FIGS. 15A to 15E. The user is next asked in decision block 208 whether forward or backward scheduling is desired. If forward scheduling is chosen by the user, the user is prompted to fill in the start date in block 210, but if backward scheduling is chosen, the user is prompted to fill in the first customer ship date in block 212.

Control then goes to decision block 214 at the top of FIG. 14B where the user is given the option to update the application profile defaults. The profiled defaults are automatically inserted by the system, and the user can elect to use the defaults or change them. If the user chooses to update the defaults, then in function block 216 the user can key in new values by typing over the those default values the user wants to update. The process then goes to decision block 218 where again the user is given the option of updating the system data, this time the definition of criticality. If the user chooses to update, then in function block 220 the user can key in new definitions by typing over those the user wants to update.

At this point, the system selects items which fulfill criticality requirements in blocks 222, 223 and 224 to produce a list of selected items in block 226. Those skilled in the art will appreciate that this sort of selection process is routinely accomplished with a database and, as previously mentioned, the preferred database is IBM's DB2. Next in blocks 228, 229 and 230 the lead times for each item in the list produced in block 226 are added to produce in block 232 at the top of FIG. 14C a list of all items and associated lead times.

Once the list produced in block 232 is produced, the system extracts additional lead times from the application profile in block 234 and these lead times are added for each item in block 236. Next, the system finds the longest lead time in the list in function block 238. All events with associated lead times are defined as activities in function block 240, and the activities for the item are listed in function block 242. A determination is made in decision block 244 whether there are more items to process in the list. If there are, control loops back to function block 238 where the next longest lead time item is found and so on. Once the last item has been processed, the files are formatted for the project management tool in function block 246.

The process of formatting the files for the project management tool, here the MAPPS project management tool, is shown in FIGS. 15A to 15E. The process begins in FIG. 15A by calling a MAPPS network data file shell in function block 250. This is an empty data file with no activities or resources. Then, in function block 252, the name of the project is printed in the file shell. This name is the conceptual design tool product name. A check is made in decision block 254 to determine if the name is valid and, if not, an error message is displayed in block 256 before control returns to block 252. Assuming a valid name has been printed to the file, the header information for the file is printed in function block 258. Checks of each of the numbers of activities, resources, connectors, and milestones are checked in function block 260, and if any fail as determined by decision block 261, an error message is displayed before control returns to function block 260.

Figure 15A:
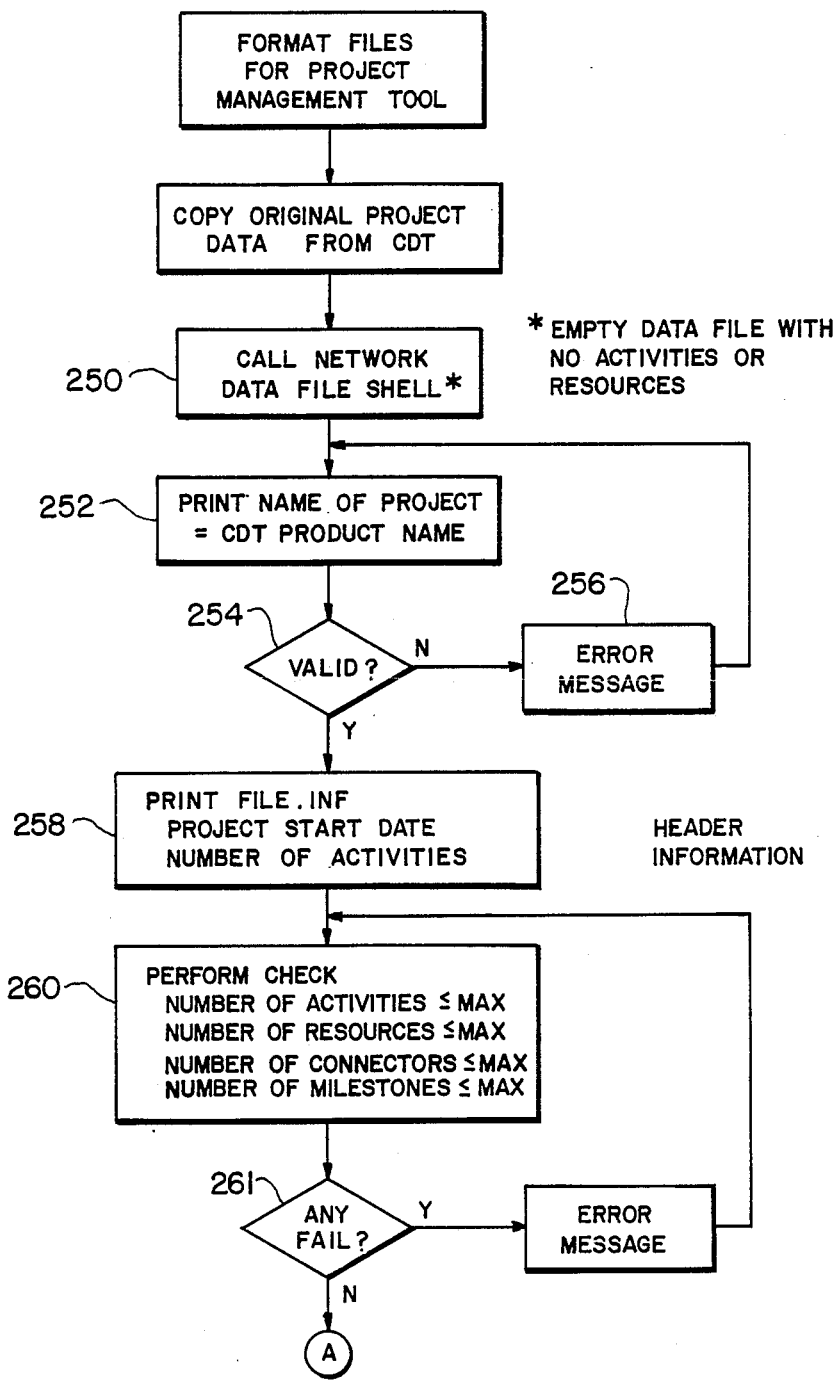
FIGS. 15A, 15B, 15C, 15D, and 15E, taken together, are a flow chart of the process of formatting files of data gathered by the conceptual design tool for the project management tool and invoked by the interface shown in FIG. 14A.
Figure 15B:
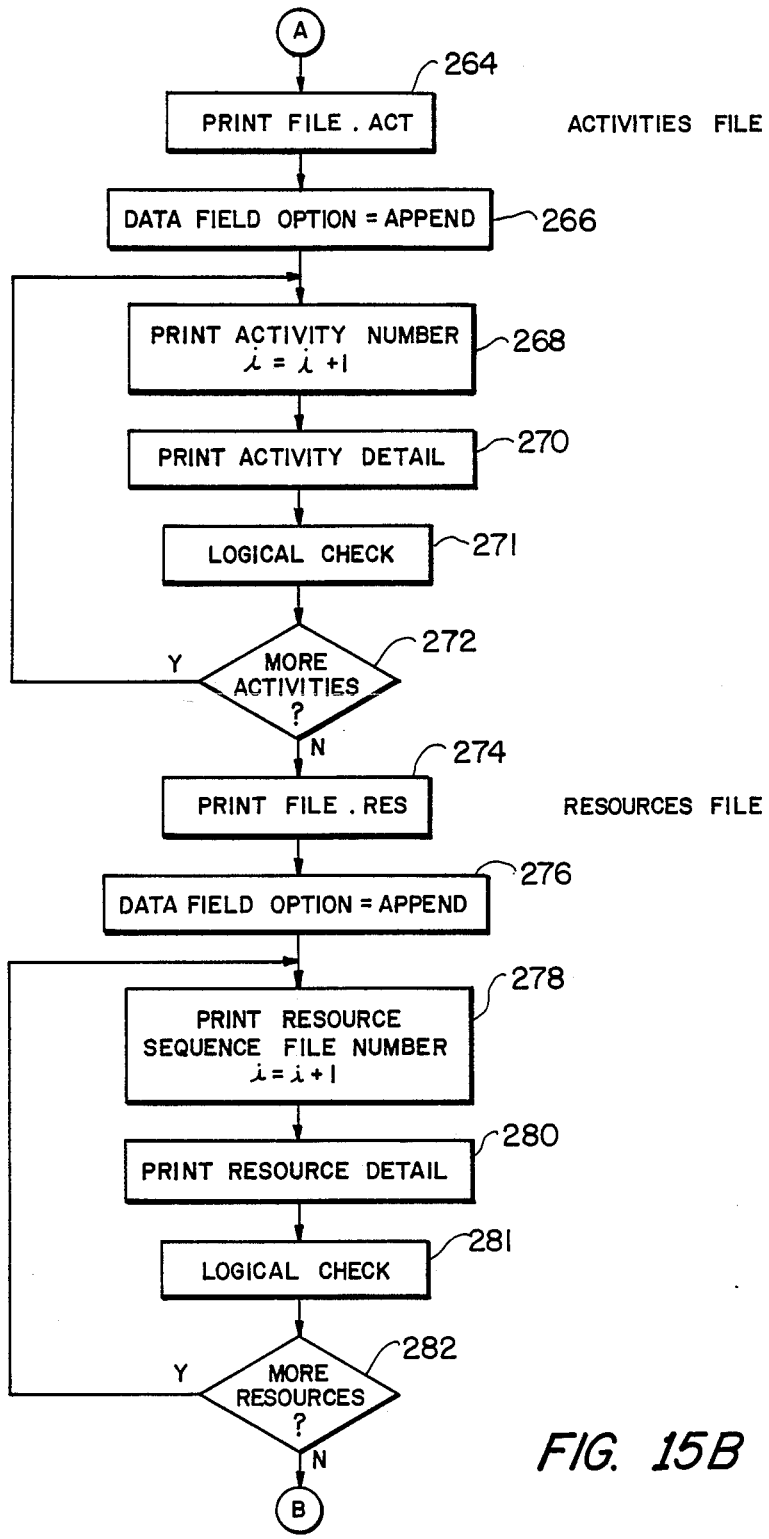

Once the header information has been printed to the file, the next step in the process is to print the activities file, as shown in block 264 at the top of FIG. 15B. The data field option is set equal to APPEND in block 266, and the process of printing activity numbers begins in block 268. Each activity number is followed by printing the activity detail to the file in block 270. A logical check is made in block 271 before a determination is made in decision block 272 as to whether there are more activities to be printed to the file.

Next, the resources file is printed to the file in block 274. The data field option is set equal to APPEND in block 276, and the process of printing resource sequence file number begins in block 278. After each resource file number, the resource detail is printed to the file in block 280. A logical check is made in block 281 before a determination is made in decision block 282 as to whether there are more resources to be printed to the file.

Figure 15C:
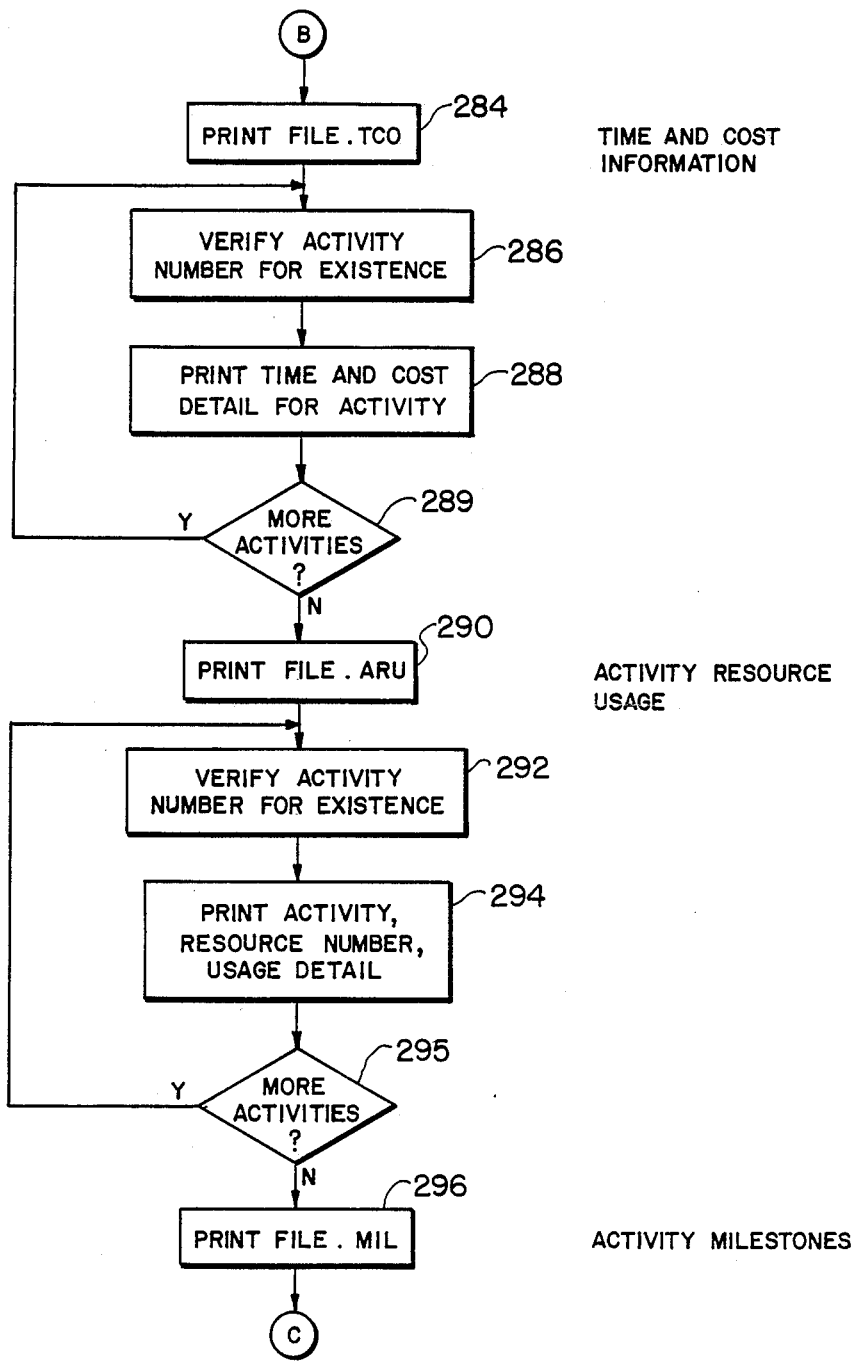
Figure 15D:
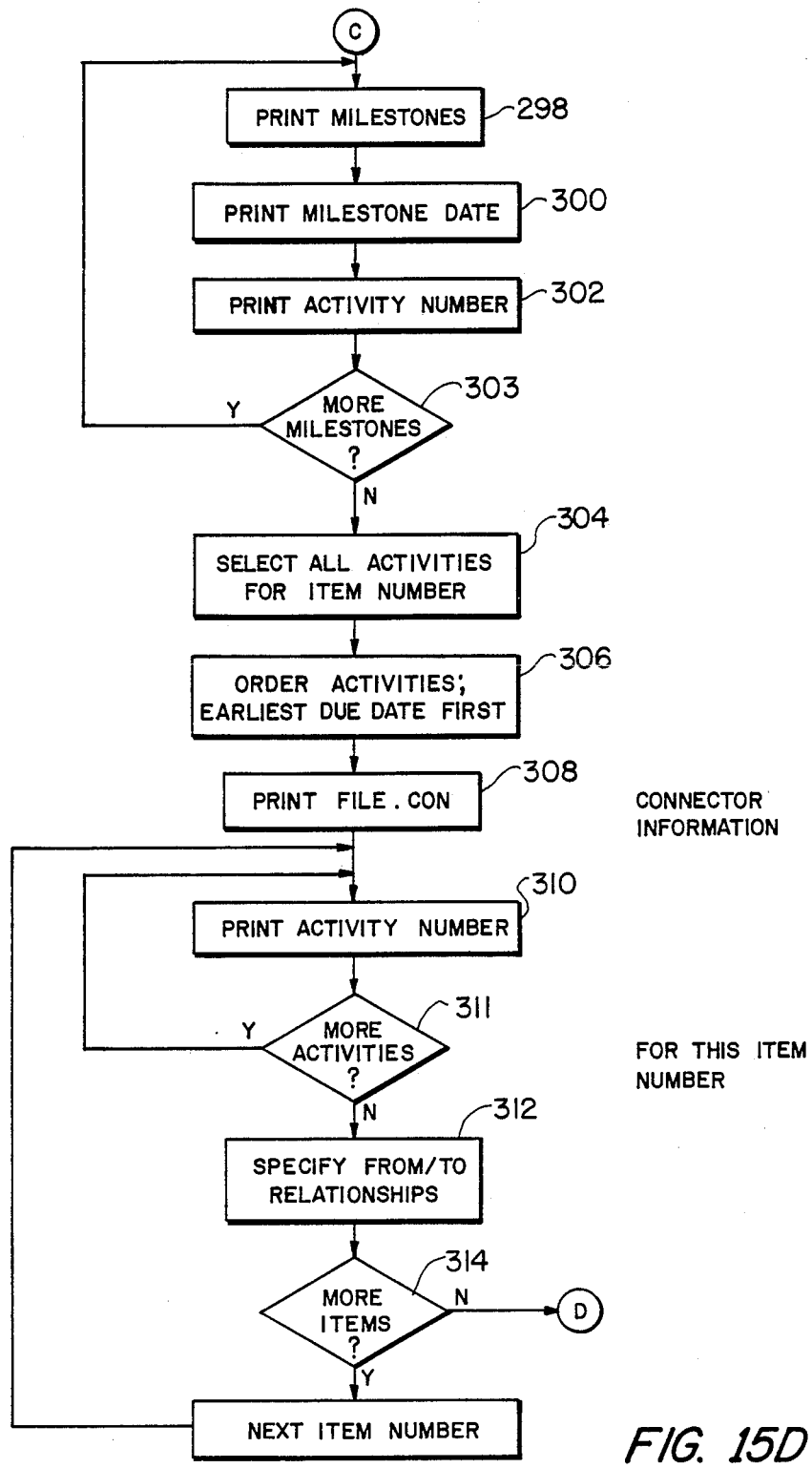

Next, at the top of FIG. 15C, the time and cost information is printed in function block 284. For each activity, the activity number is verified in block 286, and the time and cost detail is printed to the file in block 288. This process continues until a determination is made in decision block 289 that all activities have been processed.

The activity resource usage is then printed to the file in function block 290. For each activity, the activity number is again verified in block 292, and the activity, resource number and usage detail is printed to the file in block 294. This process continues until a determination is made in decision block 295 that all activities have been processed.

The activity milestones are printed to the file in function block 296. In function block 298 at the top of Figure 15D, the milestones are printed followed by the date in block 300. As this is done, the activity numbers are verified in block 302. This process continues until all milestones have been processed as determined by decision block 303.

The connector information is formatted next. In block 304 the activities for the several item numbers are selected, and then in block 306 the activities are ordered according to date. The connector file is printed to the file in block 308. For each activity, the activity is printed in block 310 until all activities have been processed as determined by decision block 311. The from/to relationships, that is the connector information, is specified in block 312 until all items have been processed as determined by decision block 314.

Figure 15E:
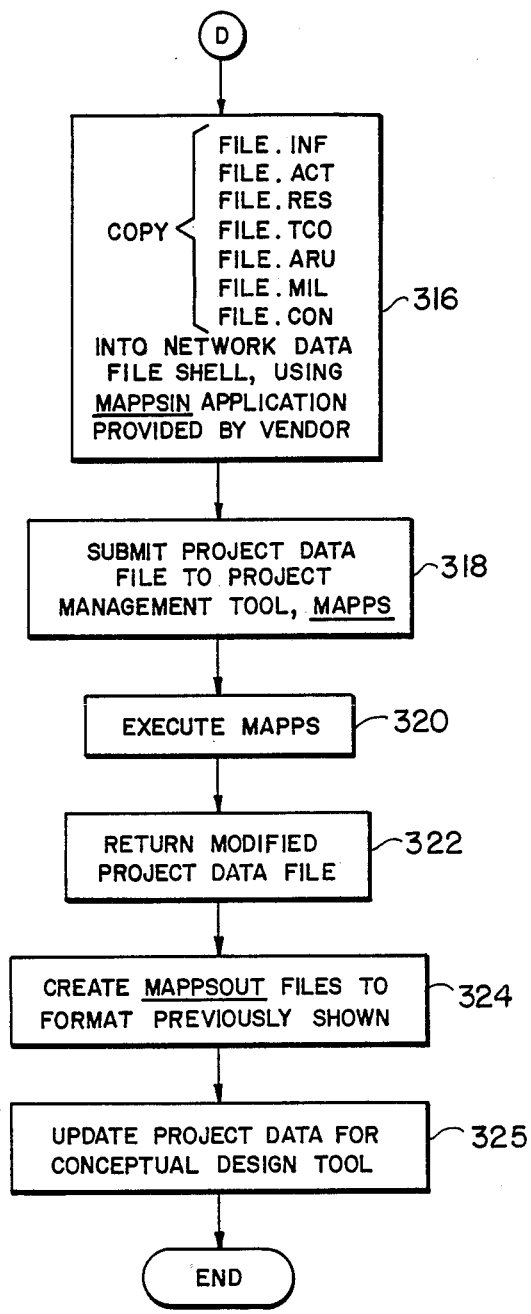

Referring now to the top of FIG. 15E, the various files which have been printed are copied into the MAPPS network data file shell using the MAPPSIN utility described above, as indicated by function block 316. Next, a project data file is submitted to the MAPPS project management tool in block 318. At this point, the MAPPS project management tool can be executed as indicated by block 320. The modified project data file is returned in block 322. The MAPPSOUT utility can then be invoked in block 324 to create a MAPPSOUT file of the format previously described. In this format, the modified project data file can be imported into the conceptual design tool to update the project data, as indicated in block 325.

The automatic transfer of information required to generate a release schedule is a major usability and productivity enhancement over existing semimanual project management systems. It utilizes available information, knowledge and interrelationships previously gathered through other required phases of planning the product release plus user interactivity to produce a product release activity sequence and schedule.

While the invention has been described in terms of a single preferred embodiment of the invention, those skilled in the art will appreciate that the invention can be practiced with modification and alteration within the spirit and scope of the appended claims. For example, while the preferred embodiment uses a relational data base, a hierarchical data base could also be used. And as previously mentioned the query system used in the preferred embodiment could be replaced by an expert system.

Having thus described our invention, what we claim as novel and desire to secure by Letters Patent is as follows:

1. A method for the automatic interfacing of a conceptual design tool with a project management tool, said conceptual design tool providing for the early manufacturing involvement information needed to aid and improve the total design and manufacturing effort to produce a final product, said method comprising the steps of:

using said conceptual design tool, prompting a user to input a functional product structure;

capturing product structure data input by the user in a database;

using said conceptual design tool, prompting a user to input manufacturing details for each item in the functional product structure;

capturing manufacturing detail data input by the user in said database;

prompting a user for rules which determine which items of the product structure are critical;

selecting items from database which fulfill criticality requirements;

ordering selected critical items according to lead times from manufacturing detail data gathered by said conceptual design tool and captured in said database;

formatting the ordered selected items in a file of said project management tool; and importing the formatted file into said project management tool.

2. The method for the automatic interfacing of a conceptual design tool with a project management tool as recited in claim 1 wherein user input manufacturing details include lead times for each item and said step of ordering selected critical items comprises the steps of:

adding lead times from said database for each selected critical item;

listing all items and associated lead times in a file in which all events and associated lead times for each item are defined as activities for the item; and listing all activities for each item ordered by lead time to produce said ordered selected items.

3. The method for the automatic interfacing of a conceptual design tool with a project management tool as recited in claim 2 wherein the step of formatting comprises the steps of:

copying original project data generated by said conceptual design tool from said data base;

calling an empty data file shell;

obtaining a name of project from said original project data and printing said name to said file shell;

obtaining a project start date and number of activities from said original project data and printing header information to said file shell;

printing an activities file ordered by activity number to said file shell;

printing a resources file to said file shell;

printing a time and cost information file to said file shell;

printing an activity resource usage file to said file shell;

printing an activity milestones file to said file shell;

printing a connector information file to said file shell; and copying said file shell with said name, header information, activities file, resources file, time and cost information file, activity resource usage file, activity milestones file, and connector information file to a network data file.

4. The method for the automatic interfacing of a conceptual design tool with a project management tool as recited in claim 1 further comprising the steps of:

executing said project management tool with said imported formatted file;

generating a modified project data file during the execution of said project management tool;

formatting said modified project data file in a file of said conceptual design tool; and importing the formatted modified project data file into said conceptual design tool.

* * * * *